(12) United States Patent
Hou

(10) Patent No.: US 6,587,145 B1
(45) Date of Patent: Jul. 1, 2003

(54) IMAGE SENSORS GENERATING DIGITAL SIGNALS FROM LIGHT INTEGRATION PROCESSES

(75) Inventor: Alpha Hou, San Jose, CA (US)

(73) Assignee: Syscan Technology (Shenzhen) Co., Ltd., Guangdong (CN)

( * ) Notice: Subject to any disclaimer, the term of this patent is extended or adjusted under 35 U.S.C. 154(b) by 0 days.

(21) Appl. No.: 09/137,364

(22) Filed: Aug. 20, 1998

(51) Int. Cl.⁷ .......................... H04N 3/14; H04N 5/335; H04N 5/235; H01L 27/00
(52) U.S. Cl. ................... 348/297; 348/230.1; 250/208.1
(58) Field of Search ................. 348/297, 298, 348/294, 308, 230, 299, 295, 302, 312, 230.1; 250/208.1

(56) References Cited

U.S. PATENT DOCUMENTS

| | | | |
|---|---|---|---|
| 4,563,089 A | | 1/1986 | Kramer |
| 4,710,817 A | * | 12/1987 | Ando ........................ 348/310 |
| 5,065,149 A | * | 11/1991 | Marsh et al. ............... 345/698 |
| 5,214,274 A | * | 5/1993 | Yang ........................ 250/208.1 |
| 5,373,295 A | * | 12/1994 | Michon ...................... 341/159 |
| 5,452,001 A | * | 9/1995 | Hosier et al. ................ 348/302 |
| 5,461,425 A | | 10/1995 | Fowler et al. |
| 5,468,954 A | * | 11/1995 | Furukawa ..................... 348/297 |
| 5,565,915 A | * | 10/1996 | Kindo et al. ................. 348/308 |
| 5,576,729 A | * | 11/1996 | Yamazaki ...................... 345/94 |
| 5,650,643 A | * | 7/1997 | Konuma ...................... 257/225 |
| 5,665,959 A | * | 9/1997 | Fossum et al. .......... 250/208.1 |
| 6,166,367 A | * | 12/2000 | Cho .......................... 348/308 |
| 6,201,572 B1 | * | 3/2001 | Chou ......................... 348/308 |
| 6,330,030 B1 | * | 12/2001 | O'Connor .................... 348/297 |

FOREIGN PATENT DOCUMENTS

| | | | | | |
|---|---|---|---|---|---|
| JP | 03129483 A | * | 6/1991 | ........... | G06F/15/68 |
| JP | 07067042 A | * | 3/1995 | .......... | H04N/5/335 |

* cited by examiner

Primary Examiner—Wendy R. Garber
Assistant Examiner—John M. Villecco
(74) Attorney, Agent, or Firm—Joe Zheng

(57) ABSTRACT

The purpose of the present invention is to provide a generic solution for direct readout of the charge signals from the photodetectors in an image sensor to minimize possible signal distortions. The disclosed image sensor uses a time measurement circuit for each of the photodetectors. The time elapsed for each of the photodetectors to reach a reference signal is measured and converted to a digital representation that is subsequently readout as the digital signals.

28 Claims, 14 Drawing Sheets

*Fig. 4E*

| 440 | | | | | | |
|---|---|---|---|---|---|---|
| 255 | 254 | 253 | | 2 | 1 | 0 |

| 430 | | | | | | |
|---|---|---|---|---|---|---|
| $C_0$ | $C_1$ | $C_2$ | | $C_{253}$ | $C_{254}$ | $C_{255}$ |

IMAGE SENSORS GENERATING DIGITAL SIGNALS FROM LIGHT INTEGRATION PROCESSES

BACKGROUND OF THE INVENTION

1. Field of the Invention

The present invention generally relates to image sensing systems and more particularly relates to an image sensor directly converting light intensity signals to digital signals without using A/D converters.

2. Description of the Related Art

There are many applications that need an imaging system to convert a target to an electronic format that can be subsequently analyzed, printed, distributed and archived. The electronic format is generally an image of the target. A typical example of the imaging system is a scanner and the target is a sheet of paper from a book or an article. Through the scanner, an electronic or digital image of the paper is generated.

An imaging system generally includes a sensing module that converts a target optically into an image. The key element in the sensing module that converts the target optically to the image is an image sensor comprising an array of photodetectors responsive to light impinged upon the image sensor. Each of the photodetectors produces an electronic (charge) signal representing the intensity of light reflected from the target. The electronic signals from all the photodetectors are readout and then digitized through an analog-to-digital converter to produce digital signals or image of the target.

It is known in the art that the electronic signals in the image sensor are serially readout, whereby the electronic signals may have passed a number of circuits that may affect adversely the quality of the electronic signals. For example, in CCD sensors, the electronic signals are serially shifted out from one charge storage to another charge storage. During the course of going through tens, perhaps, hundreds or thousands of the charge storages, the electronic signals may have been introduced to noise from other poor-performed charge storages or degraded and even distorted because of parasitic effects caused by parasitic capacitance, inductance and resistance of other components along the way. Similarly, these adverse effects exist in CMOS sensors as well. Therefore there is a great need for solutions leading to direct readout of the electronic signals.

U.S. Pat. No. 5,461,425 by Boyd Fowler and Abbas El Gamal discloses a CMOS image sensor with pixel level A/D conversion, which means that the electronic (analog) signals generated by the photodetectors are converted to a serial bit stream by an A/D converter connected at the output of each photodetector and formed in the immediate area of each photodetector within the sensor. Thus, a separate digital stream for each photodetector (pixel element) is output from the sensor and the parasitic effects and distortion are minimized.

Attaching an independent A/D converter to each photodetector may be an expensive approach. If an image sensor, is of high resolution, for example, a linear array of 300 dpi for 9 inch width or 1000 by 1000 area array would require 2,700 A/D converters in the linear array and one million A/D converters in the area array. It is known in the art that the realization of a large quantity of 8-bit or 12-bit A/D converters can occupy a fairly large area in the array, which inherently means the higher cost of the sensor. Hence it is desirable for an image sensor having the same features but without using the individual A/D converters for all the photodetectors in the image sensor.

SUMMARY OF THE INVENTION

The present invention has been made in consideration of the above described problems and needs and has particular applications to image sensors used in scanners, digital cameras and computer vision systems.

According to one aspect of the present invention, an image sensor can be fabricated as Complementary Metal-Oxide Semiconductor (CMOS) or Charged Couple Device (CCD) device in a format of either one-dimensional array or two-dimensional array. The image sensor comprises a plurality of photodetectors, each responsive to light impinged thereupon and producing an electronic leakage current or charge signal in light integration. Each of the photodetector is connected to a time measurement module that produces a digital representation of the charge signal. The digital representations of all the charge signals from the photodetectors are then sequentially read out as digital signals from a sequence of register circuits, each coupled to one of the time measurement modules.

The time measurement modules and register circuits are digital circuits and therefore can be fabricated together in the image sensor without significantly increasing the size and cost of the image sensor. Image sensors employing this invention produce signals that are not only in digital format but also of high fidelity.

One of the distinctions of the present invention from prior art system is that the image sensor can produce digital signals directly without using A/D converters. One of the benefits and advantages of the present invention is the signal fidelity. In prior art systems, the charge signals have to go through tens, perhaps hundreds or thousands of circuits, suffering various parasitic effects that cause the charge signals distorted. Using the present invention, the charge signals are converted to a digital format right after the photodetectors, minimizing possibilities of being distorted.

According to one embodiment, the present invention can be implemented as a system for generating digital signals in a sensor, the system comprising:

an array of photodetectors, each responsive to light impinged thereupon and independently producing a charge signal after the photodetectors are collectively reset by a reset signal;

a counter receiving a time mark signal and producing a count number with reference to the time mark signal;

a plurality of time mark measurement modules collectively receiving a reference signal and the count number from the counter, each of the time mark measurement modules coupled to one of the photodetectors and outputting a digital representation of the charge signal from the one of the photodetectors with reference to the reference signal and the count number from the counter, and a plurality of register circuits, each connected to one of the time mark measurement modules and receiving the digital representation therefrom, wherein the digital representation from each of the time mark measurement modules is sequentially shifted out to form the digital signals.

According to another embodiment, the present invention can be implemented as a method for generating digital signals in a sensor, the method comprising:

accumulating incident photons in a photodetector; the accumulated incident photons causing a charge signal;

comparing the charge signal with a reference signal having a level using a comparing circuit;

producing a pulse signal by the comparing circuit when the charge signal reaches the level of the reference signal;

measuring time elapsed by a latch circuit for the charge signal to have reached the level of the reference signal; a measured result thus obtained when the latch circuit receives the pulse signal; and dumping the measured result in a register circuit for output.

Accordingly, an important object of the present invention is to provide a generic solution for direct readout of the charge signals from the photodetectors in an image sensor to minimize possible signal distortions.

Other objects, together with the foregoing are attained in the exercise of the invention in the following description and resulting in the embodiment illustrated in the accompanying drawings.

BRIEF DESCRIPTION OF THE DRAWINGS

These and other features, aspects, and advantages of the present invention will become better understood with regard to the following description, appended claims, and accompanying drawings where:

FIG. 4E illustrates a look-up-table that can be used to modify the time elapsed measurement in FIG. 4A.

DETAILED DESCRIPTION OF THE PREFERRED EMBODIMENTS

Figure 1:
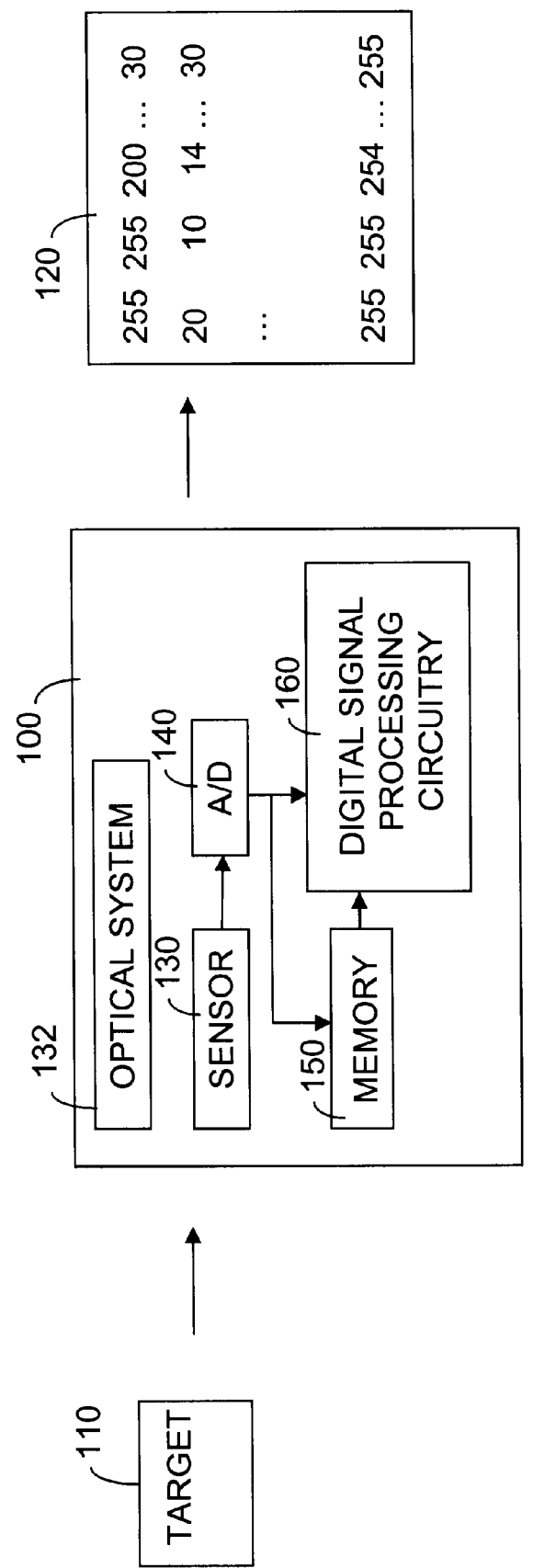
FIG. 1 depicts a schematic diagram showing an imaging system using image sensors.

Referring now to the drawings, in which like numerals refer to like parts throughout the several views. FIG. 1 shows a systematic diagram of an imaging system 100 in which the present invention may be applied thereto. Depending on applications, imaging system 100 may include, but not be limited to, a scanner, a digital camera, or an image acquisition system in which a target 110 is optically converted to an image 120.

When imaging system 100 is a scanner, target 110 is generally a scanning object that may be a sheet of paper. When imaging system 100 is a digital camera, target 110 can be of many possible things such as a scene or a group of objects. When imaging system 100 is an image acquisition system used in machine vision systems, target 110 may be a component being inspected. Nevertheless, the result from imaging system 100 is always the same, namely an intensity (black-and-white) digital image 120 or a color image 120 of target 110.

Image 120 typically is an array of pixels, each having a value between 0 to 255 if presented in an 8-bit format and a different maximum value if presented in other bit formats (10-bit, 12-bit, 14-bit, 16-bit . . . ). To be more specific with the 8-bit format, if a cluster of pixels having values of 255, a spot in target 110 corresponding to the cluster is all white. Conversely if a cluster of pixels having values of 0, a spot in target 110 corresponding to the cluster is all black. Understandably, any pixels having values between 0 and 255 represent the light reflectance variations in target 110. When imaging system 100 is capable of reproducing colors, image 120 typically comprises three individual gray scale images, each generally representing red, green and blue intensity image. In other words, each dot in target 110 is represented by a three-intensity-value vector, such as [23, 45, 129], in a color image produced by imaging system 100.

It is generally understood, regardless the actual applications, imaging system 100 comprises at least an image sensor 130 and an optical system 132. Optical system 132 collects image light from target 110 and focuses the image light upon image sensor 130, thereby an image of target 110 is imprinted onto image sensor 130. As used herein, image or incident light means either reflected light from (opaque) target 110 illuminated by a front light source or the transmitted light from (transparent) target 110 illuminated by a back light source. Typically, image sensor 130, comprising a plurality of photodetectors, is fabricated as Complementary Metal-Oxide Semiconductor (CMOS) or Charged Couple Device (CCD) device and configured as either a one-dimensional array, referred to as linear sensor, or two-dimensional array, referred to as an area sensor. The photodetectors are highly sensitive to light and each produces a proportional charge signal with respect to the strength of the image light. Again as used herein, a charge signal means a signal generated from a photodetector due to the incident light. To be more specific, a charge signal may mean the discharged signal in CMOS or the charged signal (electrons) of a photodetector modeled as a well in CCD.

The operation of image sensor 130 often comprises two processes, the first being the light integration process and the second being the readout process. In the light integration process, each photodetector accumulates incident photons of the image light and the accumulation is reflected as a charge signal. After the light integration process, the photodetector is masked so that no further photons are captured. Meanwhile the photodetectors start the readout process during which the charge signal in each photodetector is individually and serially readout as an electronic signal, via a readout circuitry, to a data bus or video bus.

Coupled to the data bus, there is an analog-to-digital (A/D) converter 140 that digitizes the electronic signals from all the photodetectors to digitized signals that can be appropriately and subsequently stored in memory 150. Typically imaging system 100 further comprises a digital signal processing circuitry 160 that, depending on the use of imaging system 100, may adjust, correct, preprocess and compress the digitized signals to eventually output an appropriate digital image or signal.

As described above, the charge signal in each photodetector is individually and serially readout as an electronic or pixel signal, via a readout circuitry, to a data bus or video bus from which the electronic signals are digitized. To be more specific, in CCD type, the charge signals generated in the photodetectors are stored respectively in corresponding charge storage (capacitors) and are serially shifted out from one charge storage to another charge storage while in CMOS type, the charge signal stored in each capacitor is simultaneously readout through an array of readout switches to a video bus but serially shifted out of the video bus. If a linear array has thousands of photodetectors (capacitors), which means some charge signals would have to travel the thousands of capacitors to be eventually readout. The final electronic signals could be severely distorted during the course because of many adverse effects along the way as described above.

Figure 2:
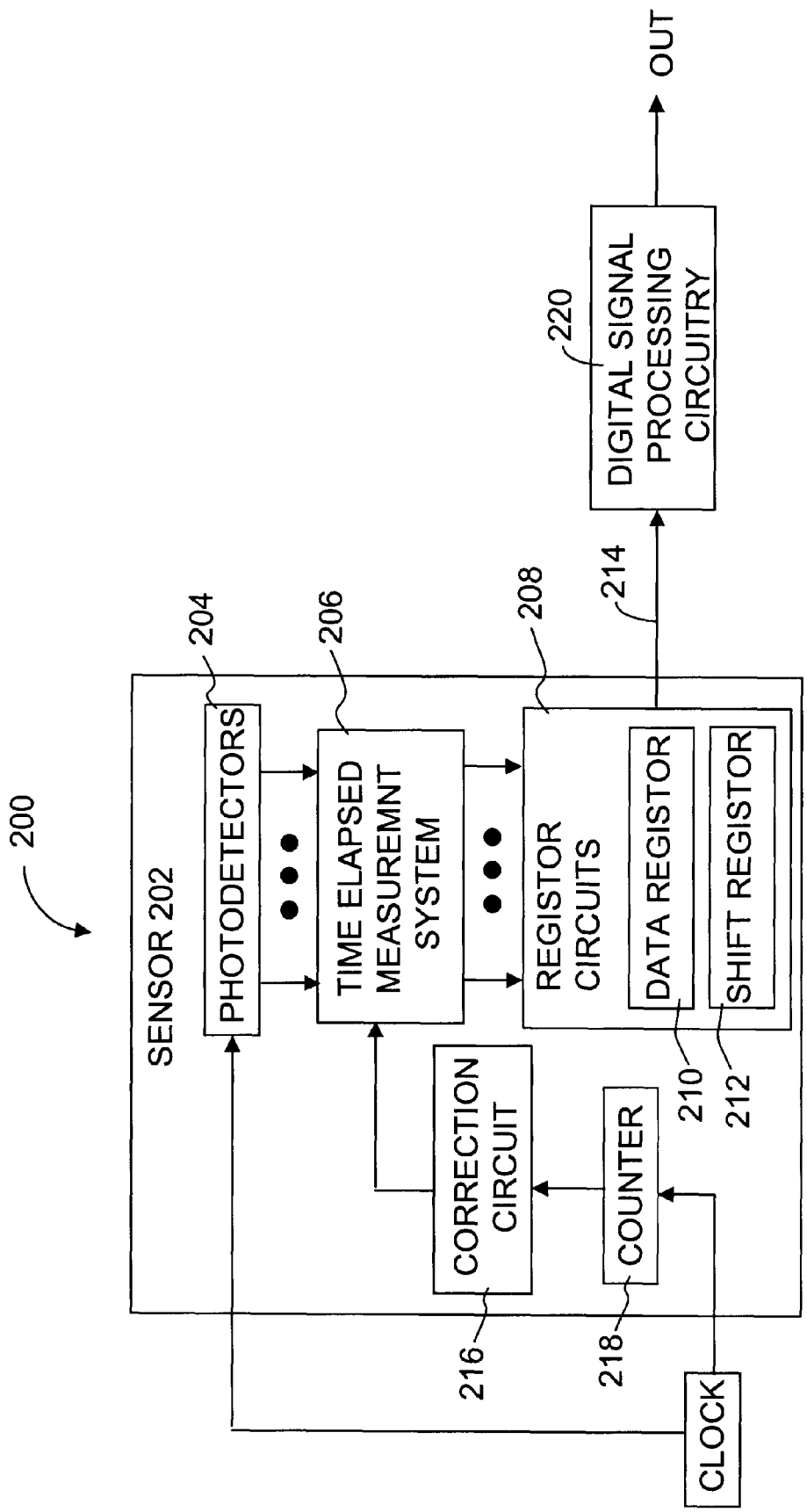
FIG. 2 illustrates an imaging system employing an image sensor according to the present invention.

FIG. 2 illustrates an overview of an imaging system 200 employing the present invention. In addition to photodetectors 204, image sensor 202 in imaging system 200 now comprises a measurement system 206 performing time elapsed measurement for all the photodetectors. To facilitate the measurement system 206 to work properly, a counter 218 generates a time mark signal that is adjusted or processed in a correction circuit 216. Subsequently, digital representations of the electronic signals are obtained and dumped from the measurement system 206 to register circuits 208. The final digital signal or image is obtained by serially or partially in parallel reading the digital representations out of register circuits 208 through a data bus 214 to a digital signal processing circuitry 220.

One of the distinctions of the present invention from prior art systems is that there are no traditional A/D converters in image sensor 202 nor in imaging system 200. The output signals from image sensor 202 are in digital format. It can be appreciated that the size of image sensors can be kept the normal size without implementing a large quantity of A/D converters. Another one of the distinctions of the present invention from prior art systems is the possibility of partially parallel outputs to increase the overall system performance. Further the concept of using the time measured from the light integration of the photodetectors to convert the charge signals generated in the photodetectors to digital signals is a fundamental departure from the concept of sampling an analog signal through A/D converters.

Figure 3A:
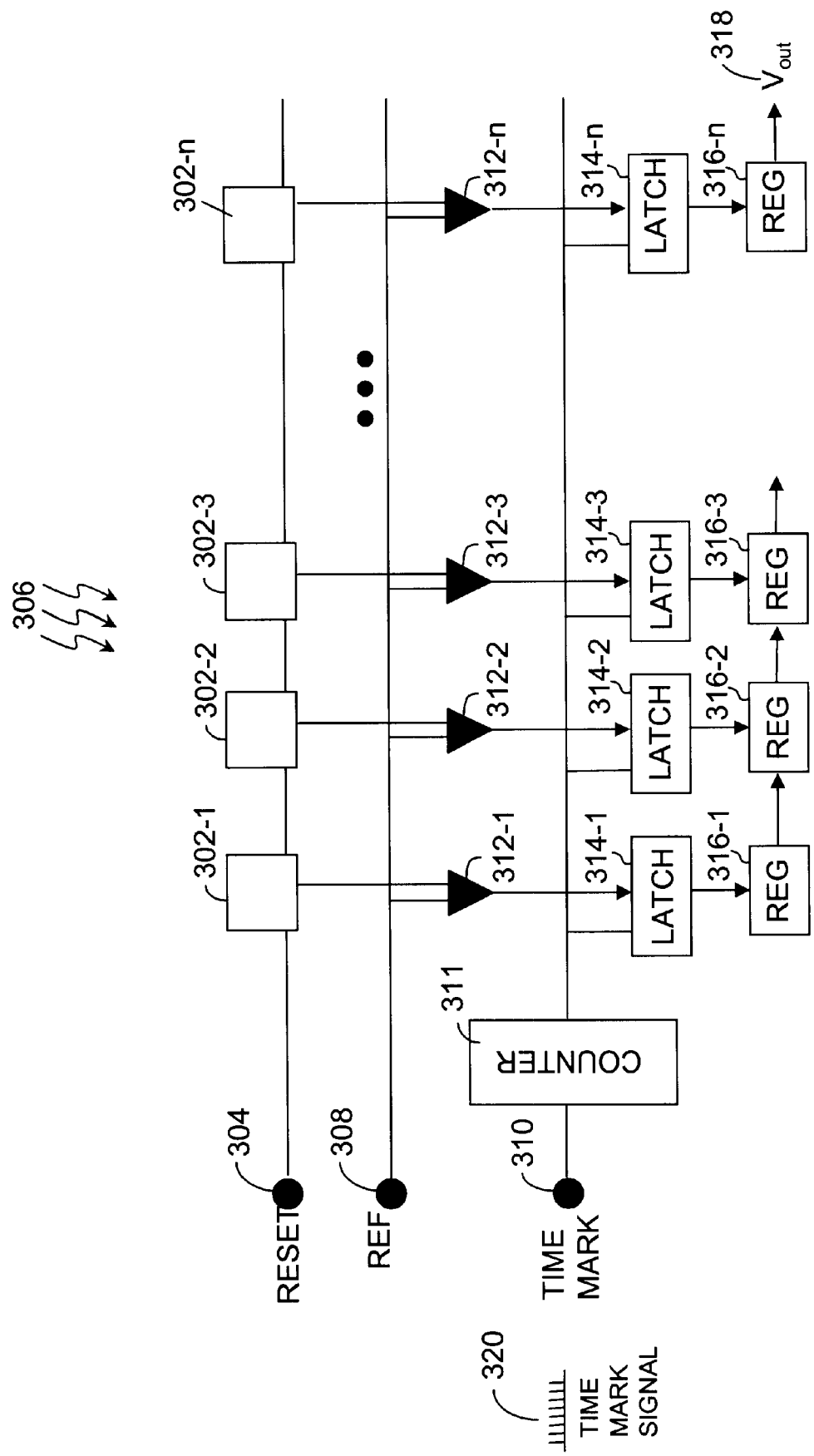
FIG. 3A illustrates an embodiment of the image sensor used in FIG. 2 according to the present invention.
Figures 3B, 3C:
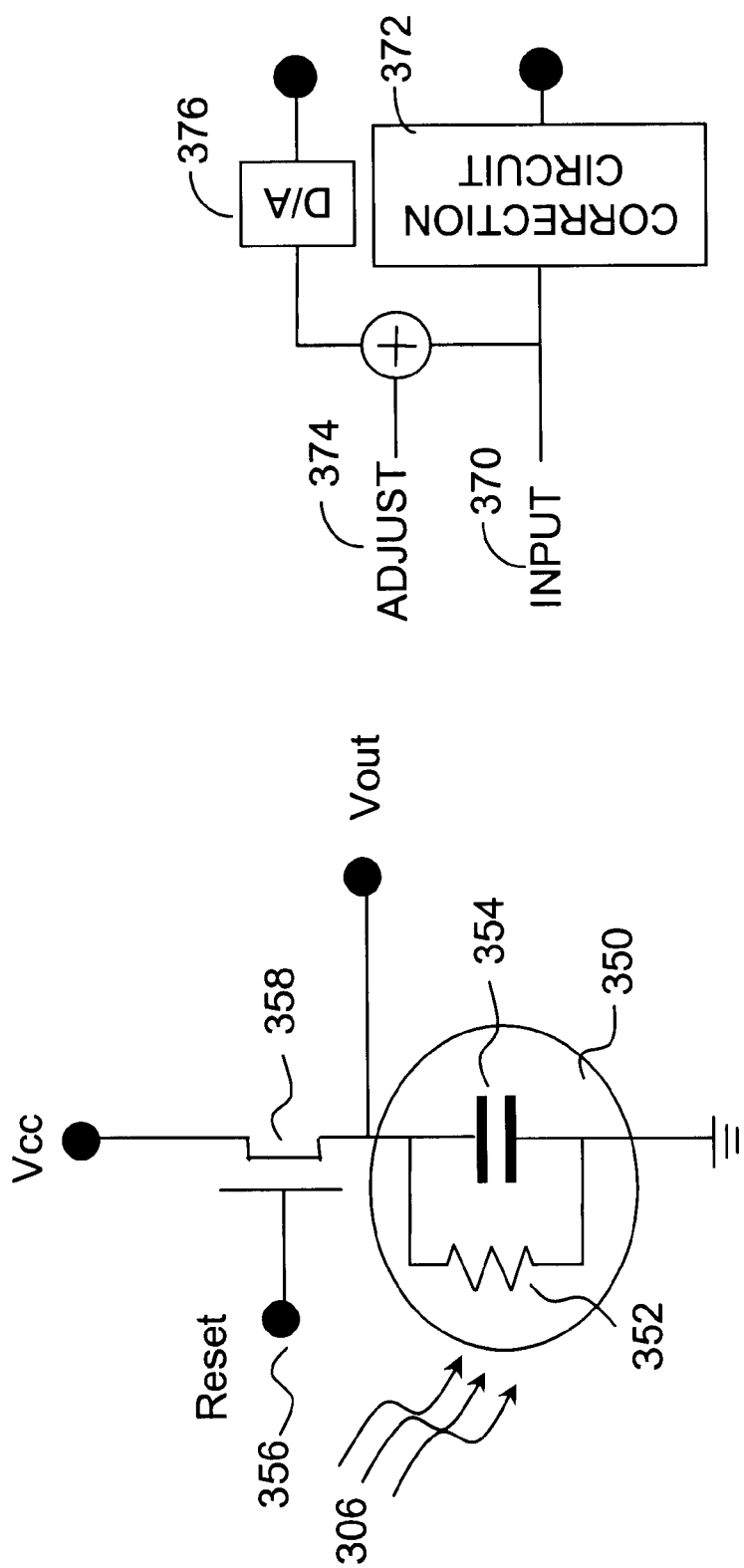
FIG. 3B demonstrates a circuit model of a photodiode in CMOS image sensor.
FIG. 3C shows one exemplary implementation of the correction circuit that can be used in FIG. 3A to modify the resultant digital signals.

To facilitate the detailed description of the present invention, FIG. 3A depicts one embodiment of image sensor 202 of FIG. 2 and shall be understood in conjunction with FIG. 2. Sensor array 204 of FIG. 2 comprises n photodetectors 302-1, 302-2, 302-3 . . . 302-n. Each of the photodetectors 302 is collectively connected to a reset connector 304. When an appropriate reset signal is applied to reset connector 304, photodetectors 302 are all cleared and starts light integration process, namely accumulating photons from image light 306. In CMOS sensors, a photodetector can be viewed as a photodiode that can be simply modeled as a resistor 352 and a capacitor 354 as shown in FIG. 3B. When a reset signal is applied at "Reset" 356, capacitor 354 is fully charged by Vcc through transistor 358, which means that photodetector 350 is ready for light integration (the charge by Vcc to capacitor 354 is stopped). As more and more incident photons from image light 306 come to photodetector 350, the resistance of resistor 352 decreases. Capacitor 354 starts to discharge through resistor 352. Typically, the higher the photon intensity is, the more photons a photodetector collects, hence the smaller resistance resistor 352 has, consequently a faster discharge signal Vout yields. In other words, the signal from Vout is proportional to the photons impinged upon the photodetector and referred to a charge signal herein alternatively.

Each of photodetectors 302-1, 302-2, 302-3 . . . 302-n in FIG. 3A may be viewed as a photodiode described in FIG. 3B. Reset connector 304 is collectively connected to the "Reset" of all the photodetectors and applied by a reset signal that causes all the photodetectors ready for the light integration. Each output of the photodetectors is compared with a reference signal received from reference connector 308 through a respective gate circuit, one of 312-1, 312-2, 312-3 . . . 312-n, that produces a signal when the output of the photodetector reaches the reference signal in magnitude. To be more specific, for example, the gate circuit receiving two signals, one being the reference signal having a constant voltage 100 mv and the other being the charge signal. The gate circuit only outputs the signal when the charge signal reaches 100 mv.

If it is assumed that the reference signal has a level R, then each output of gate circuits 312 signals respectively when a corresponding photodetector has accumulated enough incident photons to have reached the level R.

It is understood that image light 306 comprises optical information describing an imaging target and so the photon intensity is distributed according to the imaging target. Typically, the brighter the reflected light is, the higher density the photons have. The accumulation speed of incident photons 302 from image light 306, namely, the integration time, depends largely on the photon intensity. Unless the imaging target has a uniform color, all gate circuits 312 will produce a respective response signal at a variable time, in proportion to the light reflected from the image target.

Latch circuits 314-1, 314-2, 314-3, . . . , and 314-n, each outputs a time mark value, namely the digital representation of the charge signal in the photodetector. To be more specific, a time mark signal 320 is applied at mark time signal connector 310 from which counter 311 counts the time marks in time mark signal 320 once the light integration of all the photodetectors starts. Each of the latch circuits 314 latches respectively and independently the count number or time measured result when a corresponding gate circuit outputs a signal. In other words, one latch circuit latches in the count number when the corresponding photodetector has accumulated enough photons to reach the reference level. Those skilled in the art understand the implementation of the circuits 312. One implementation is simply to use a number of latches, each output one bit signal, depending on the precision of the digital representation. For example, for an 8-bit precision, each latch circuit needs only eight latches, each for one bit of the binary number. It should be noted, however, that counter 311 continues the counting of the time marks in the time mark signal and is reset only at the end of the light integration.

Figure 4A:
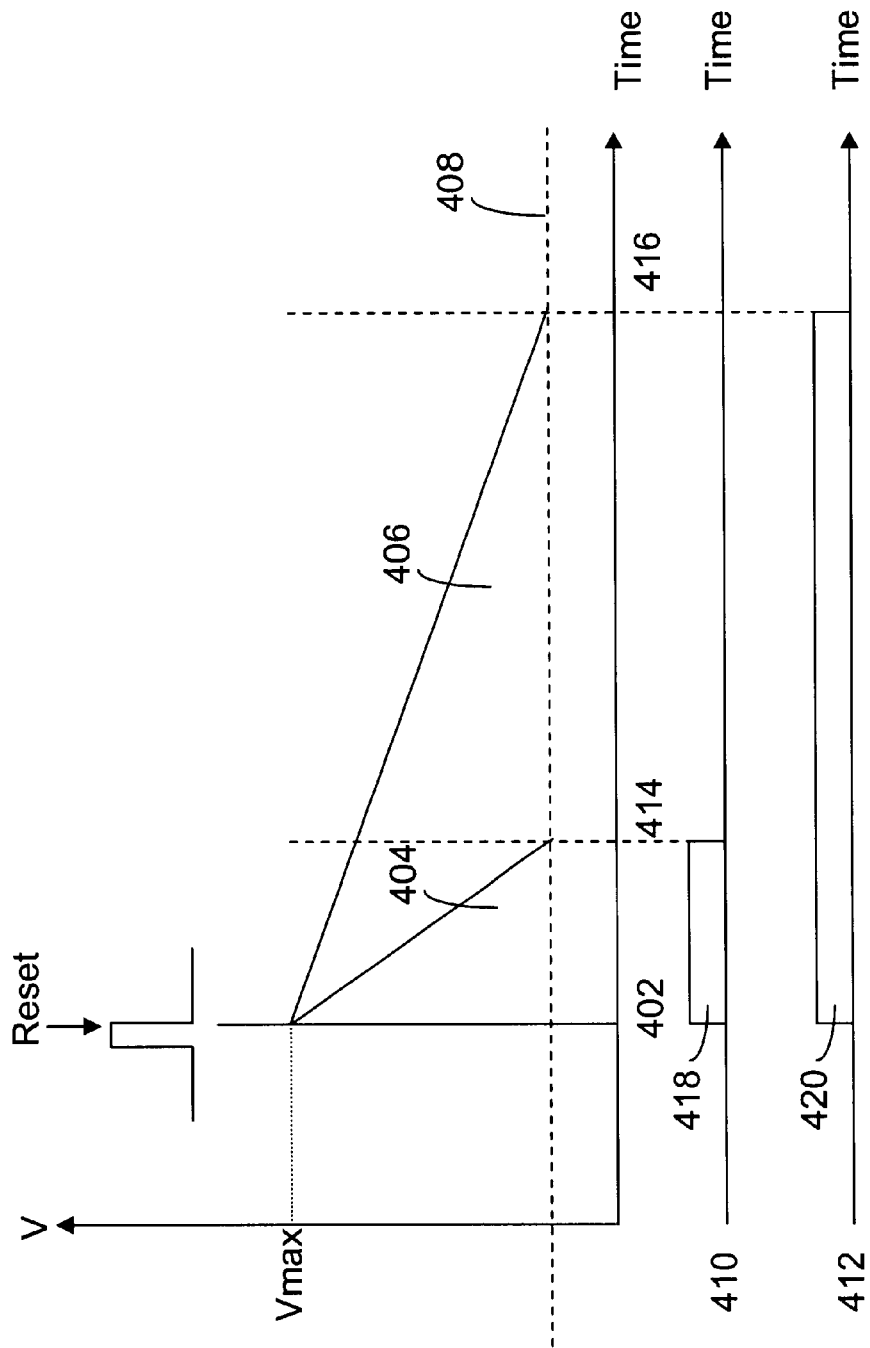
FIG. 4A demonstrates the time elapsed measurement for two exemplary CMOS based photodetectors.

To facilitate further understanding of the present invention, FIG. 4A illustrates the time elapsed measurement for two exemplary CMOS based photodetectors. The two photodetectors are reset by a reset signal that causes the two photodetectors fully charged to Vmax, wherein Vmax is typically a voltage applied to the image sensor. The two photodetectors are then started to accumulate the photons at 402. Both photodetectors 404 and 406 are accumulating photons, but photodetector 404 experiences incident photons with higher intensity than photodetector 406 does and therefore takes less time to discharge to the reference level 408 (in dotted line). Two different time measurements 410 and 412 measure, respectively and independently, the time 418 and 420 elapsed for the accumulation of photons or the discharge by photodetectors 404 and 406 to reach the reference level 408. Because of the photon intensity difference, photodetector 404 reaches reference level 408 at 414 while photodetector 404 reaches reference level 408 at 416.

Figure 4B:
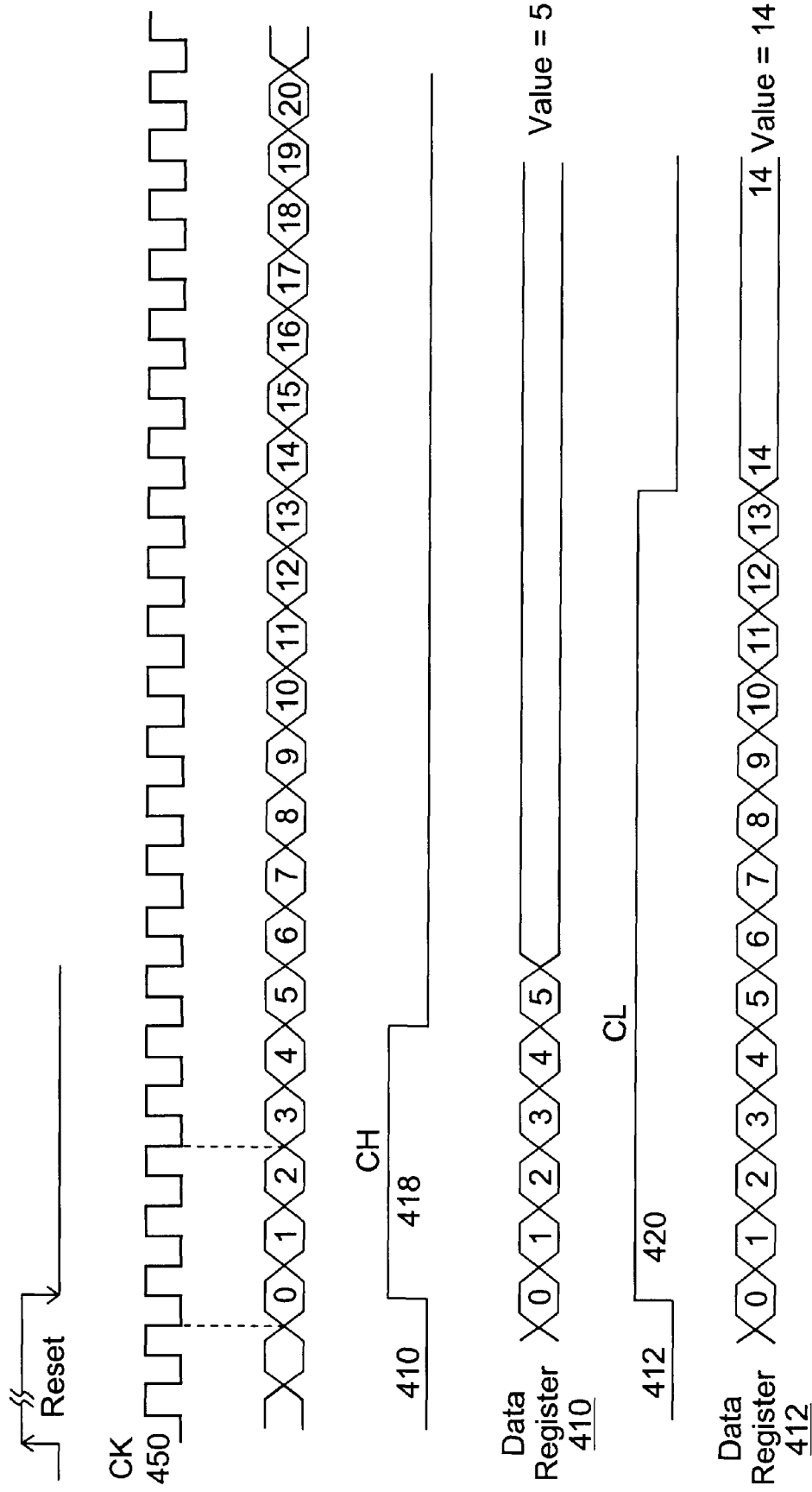
FIG. 4B shows a time mark signal being measured according to the time elapsed measurement in FIG. 4A.

FIG. 4B shows time mark signal 450 that can be applied to time mark connector 310 of FIG. 3A. Typically time mark signal 450 is a sequence of pulses whose frequency is normally adjusted with the required precision of the digital signals. For example, the resultant digital signals are represented in an 8-bit format and the time for a photodetector to accumulate photons to the level of the reference signal is assumed to be 0.1 milliseconds (ms). Then the frequency of time mark signal 450 is determined to be at least as follows:

$$\frac{0.1 \text{ ms}}{255} = 0.0003922 \text{ ms}$$

which is equivalent to 2.55 MHz.

As illustrated in FIG. 4B, photodetector 404 takes a shorter time 418 to reach the reference level while photodetector 406 takes a longer time 420 to reach the reference level. During the time elapsed, the pulses in time mark signal 450 was respectively counted within time frame 418 and 420, hence there are two respective values $C_H$ and $C_L$. For example, $C_H$ is measured 5 pulses while $C_L$ is measured 14 pulses. To map values $C_H$ or $C_L$ to digital representation of the charge signal in a photodetector, a precision function is needed and controlled by the required precision of the digital representation.

Figure 4C:
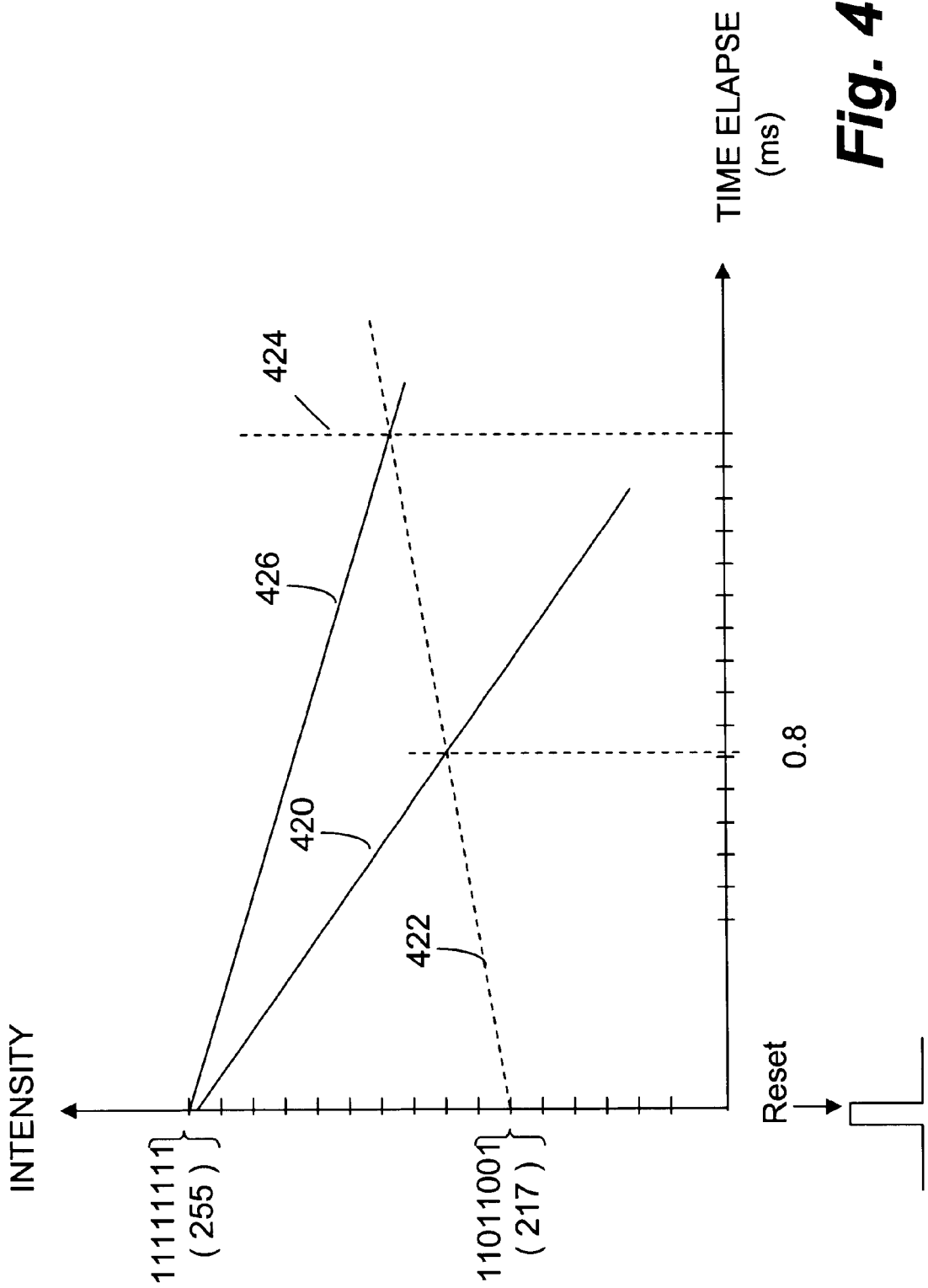
FIG. 4C illustrates the concept of the countdown method used to derive the digital representation of a charge signal.

According to one embodiment of the present invention, the precision function is a countdown method. FIG. 4C illustrates the concept of the countdown method. Digital representations of each pixel signal in each of the photodetectors is reset to be a full white, for example, 255 or 11111111 in 8-bit precision. As the photons are accumulated in one photodetector, the value for the pixel signal is linearly counted down till the accumulation of the photons causes the photodetector to reach the reference level R. As shown in the figure, a photodetector is discharged as the photons are accumulated, the latch circuit for the photodetector outputs a value 217 or 110110001 when reference level 422 is reached. The time elapsed for the photodetector to cross over the reference is 0.8 ms. For $C_H$=5 and $C_L$=14 in the above example, the digital output of the respective latch can be 250 and 241 in decimal respectively.

Figure 4D:
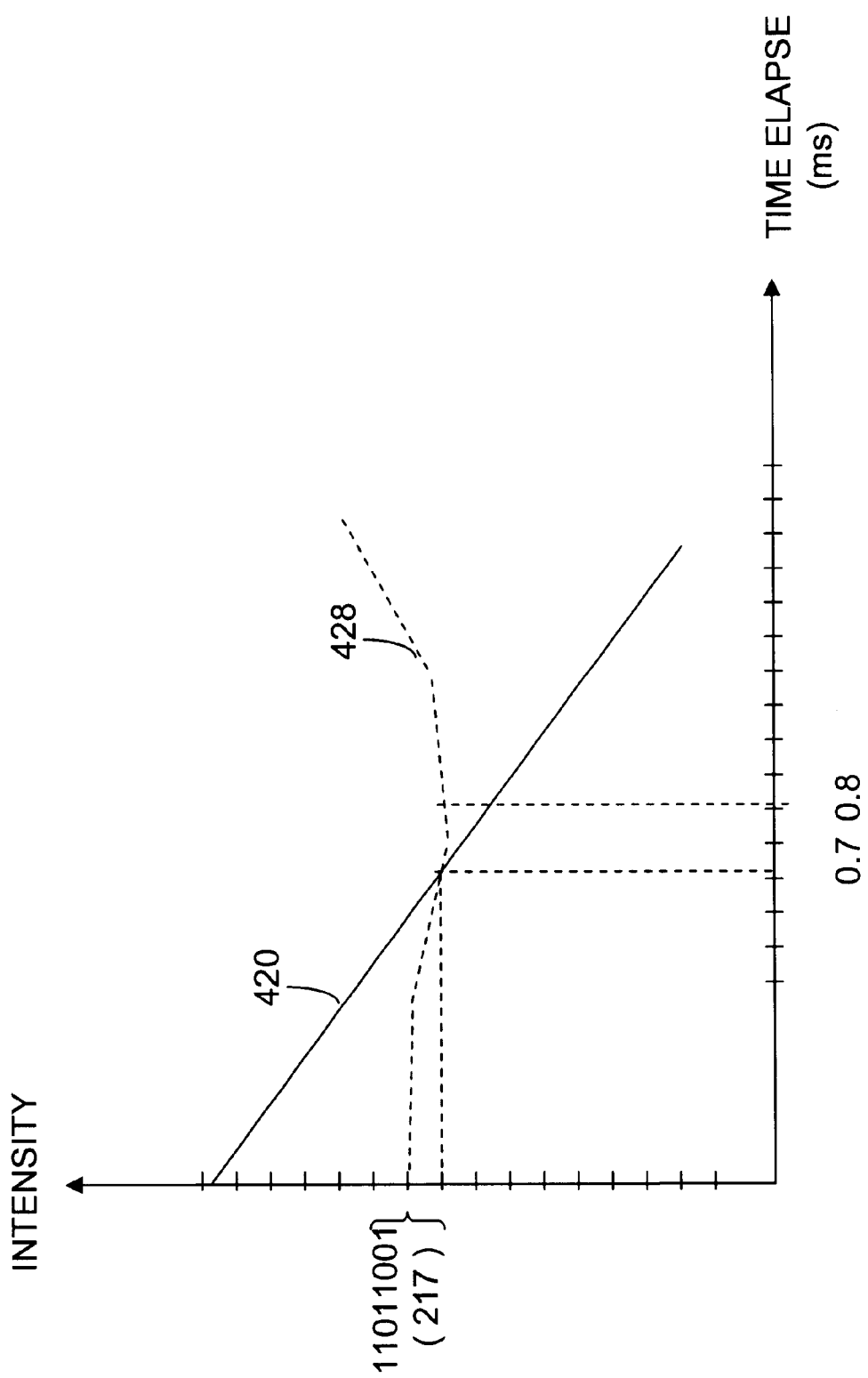
FIG. 4D illustrates one example of the reference signal that can be used in the present invention.

It should be pointed out that reference level 422 is FIG. 4C is linearly increased. According to one embodiment, the linearly increased reference level is to accommodate the situation in which the incident light is so weak that the accumulated photons could not cause the photodetector to discharge 426 to a constant reference level within a time limit 424, so causing missing data in final digital output. With the linearly increased reference, as the time goes by, the discharge 426 is made to hit the reference 417 so as to generate an output which generally represents a low pixel value. Those skilled in the art can appreciate that there are other methods that can be used to adjust the output of the latches according to the specific applications. For example, the reference signal can be adjusted to be piecewise linear such as the one 428 shown in FIG. 4D in which the reference signal can be programmed to correct the maximum integration time or perform sensitivity corrections in image sensors. One of the common corrections required is the gamma correction due to the sensitivity difference between the image sensors and human sensing systems. Using a reference signal to perform the correction in the image sensors is fundamentally different from the prior art systems in which the corrections are mostly performed through a software application or specifically designed circuit.

Figure 4E:
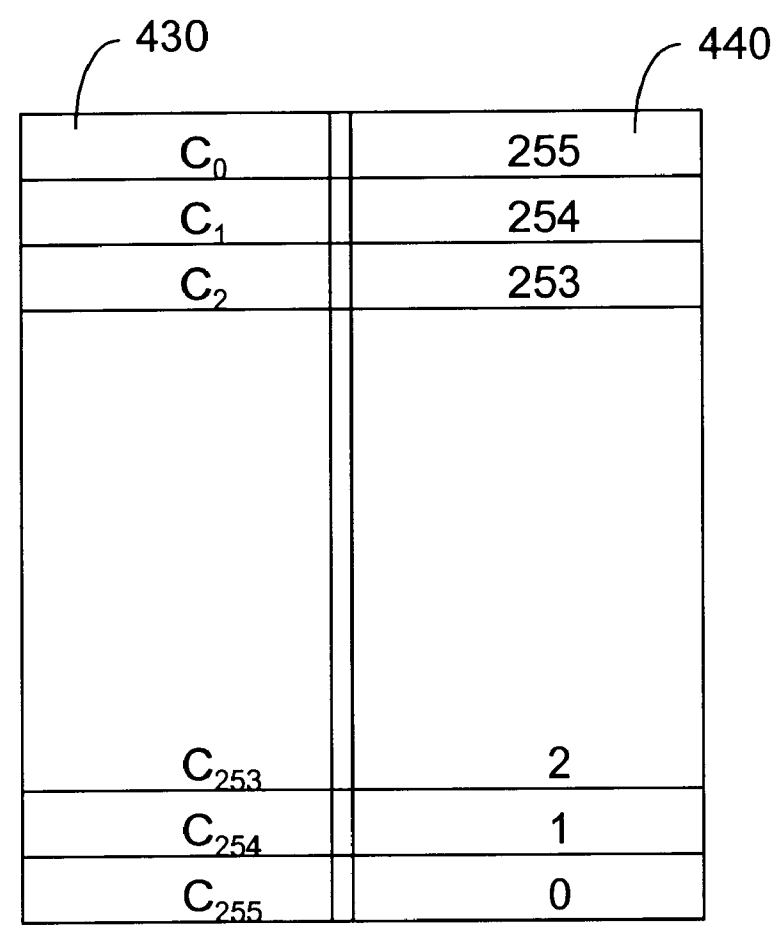

FIG. 4E illustrates another embodiment of the precision function that is implemented as a look-up-table. Entries in column 430 include all the possible counters for the time marks in a time mark signal and output column 440 includes respective digital representations that are adjustable according to specific needs. It should be noted that the entries in the column 430 or 440 do not have to be linear. In summary, the sensitivity of an image sensor can be relatively adjusted using the precision function implemented in various ways.

To complete the description of the correction circuit, FIG. 3C illustrates an exemplary implementation of a correction circuit 372 in which the precision circuit can be realized. An input signal 370 that may be a count number from counter 311 or time mark signal 320 of FIG. 3A goes through correction circuit 372 that may use a precision function that alters input signal 370 according to a desired need. To be more specific, when input signal 370 is time mark signal 320 that typically has evenly spaced time marks. After correction circuit 372, time marks in time mark signal 320 may have been altered such that the count number is not linearly changed, resulting in a nonlinearly time measurement. If input signal 370 is a count number, through correction circuit 372 that implements the look-up-table of FIG. 4E, a modified count number is generated. The actual implementation of correction circuit 372 is now apparent to those skilled in the art. Adjust signal 374, which is typically a digital signal, optionally along with input signal 370, can be used to control the reference signal through a digital-to-analog (D/A) converter 376.

Returning now to FIG. 3A, each of latch circuits 314 produces a digital representation of the charge signal. These digital representations are typically dumped simultaneously to a plurality of register circuits 316 for a readout process. Each of the register circuits 316 is connected to one of latch circuit 314 and receives the respective digital representation. The digital representations in register circuits 316 are then readout to produce the digital image 318 of the reflected light or image target.

It is noticed that signals in register circuits 316 are now in digital format and therefore there can be many ways to readout the digital representations in register circuits 316. One of the common ways is to serially shift the digital representations out register circuits 316 to produce the digital image of the reflected light. Another way is to segment register circuits 316 into several groups within each group the digital representations are serially shifted out while the outputs of the groups are readout in parallel. This combination of serial and parallel readouts can significantly improve the overall system performance.

Figure 3D:
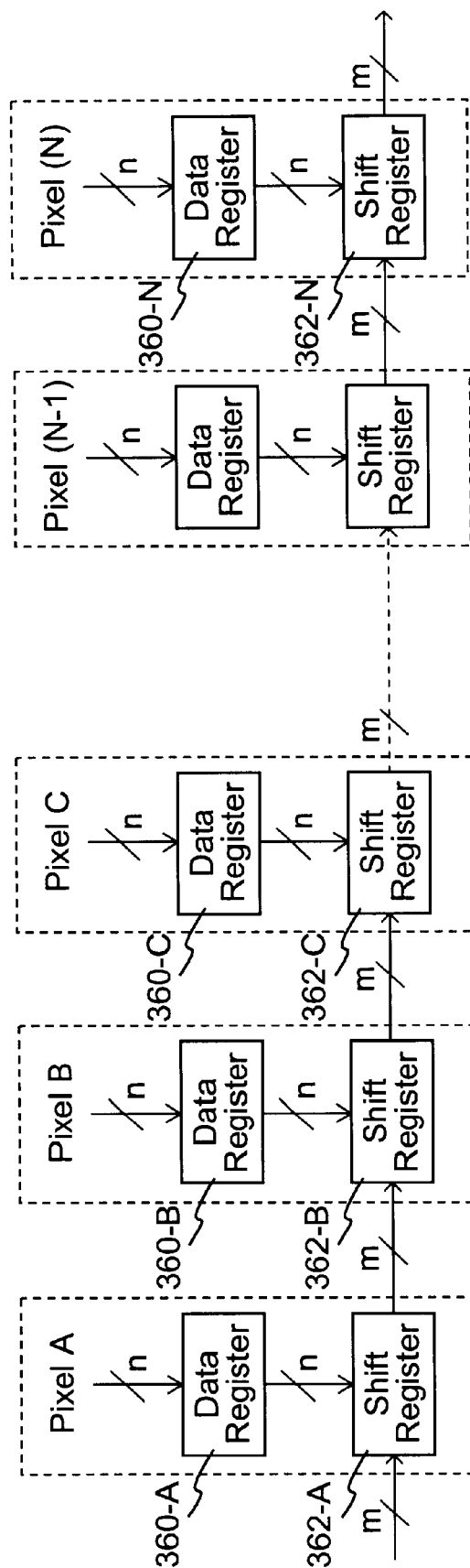
FIG. 3D illustrates one exemplary implementation of a register circuit that can be used in FIG. 3A to increase the signal throughput rate of the image sensor.

FIG. 3D shows an implementation of the register circuit according to one embodiment of the present invention. Register groups 360 corresponding to data registers 210 of FIG. 2 are used to store digital representations from latch circuits 314 and each of register groups 360 comprises n data registers depending on the precision of final digital signals. For example, the final digital signals are in 8-bit precision, then eight registers are in each of register groups 360 and each then corresponds to one shift register in one of shift register groups 362. The data in each of the data registers are then dumped to shift registers 362 that correspond to shift registers 212 of FIG. 2. The digital representations in shift registers 362 can be serially readout in parallel, namely one complete pixel signal can be readout once. If there are m bits in one pixel signal, those skilled in the art can appreciate that the readout speed of the digital representations can be increased by m times.

Figure 3E:
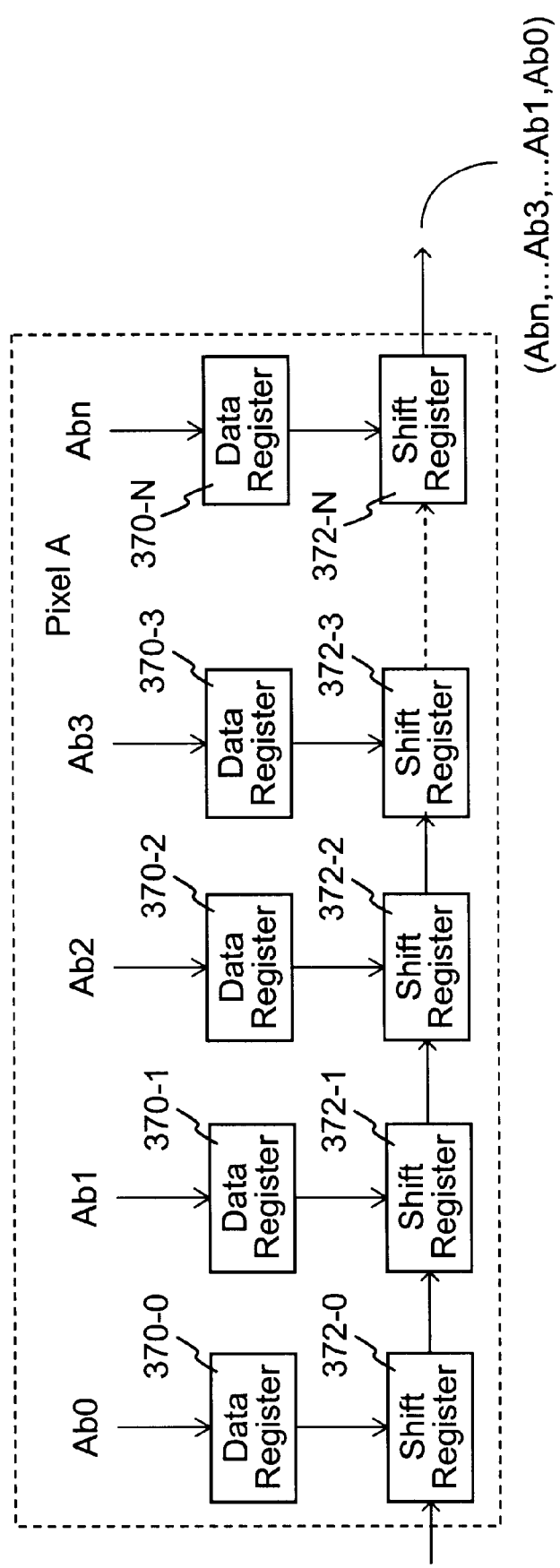
FIG. 3E demonstrates the internal connections of the register circuit comprising data registers and shift registers for one photodetector in FIG. 3A.
Figure 3F:
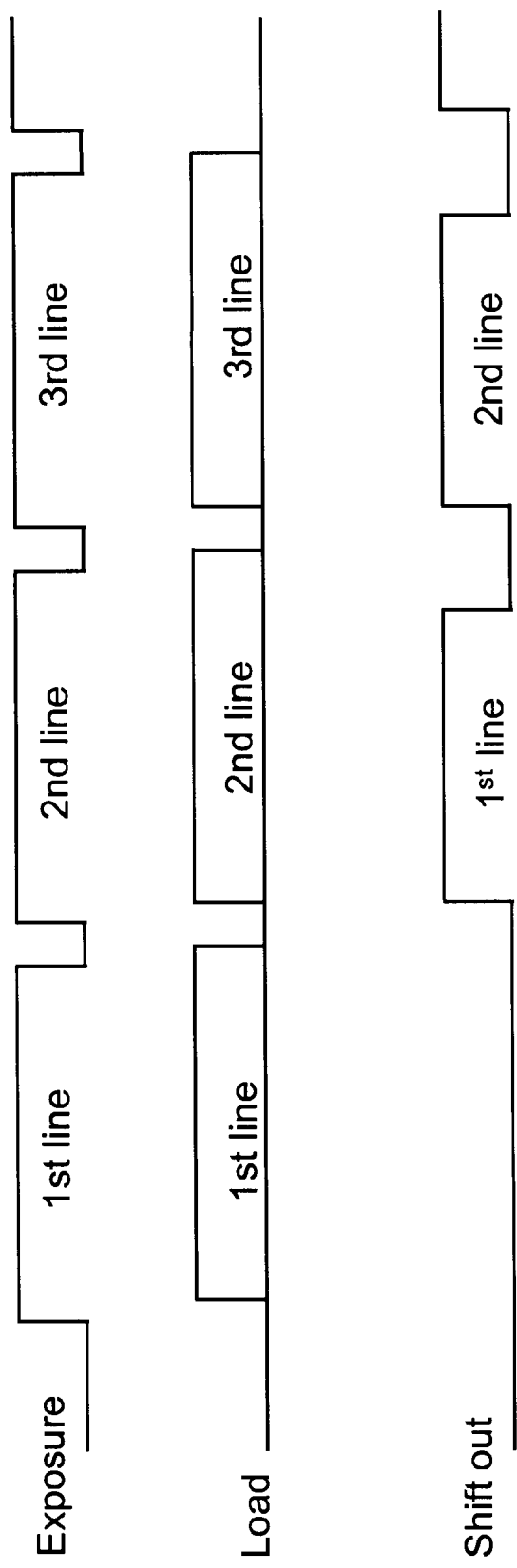
FIG. 3F shows a set of timing diagrams to illustrate that the use of data registers and shift registers in the register circuit improves the signal throughput rate.

To better understand this embodiment, FIG. 3E illustrates the readout of one charge (pixel) signal assumed in (n+1)-bit precision. There are n+1 data registers 370 and n+1 shift registers 372. Each of data registers 370 holds one bit signal of the output from the respective latch.circuit. For example, the output (count number) is 16 or 0001000 in 8-bit precision, each of the digits is stored in each of data registers 370 and then dumped to the respective shift registers. The bit signals in the shift registers are serially shifted out in parallel, namely 8 bits of the signal come out at one time. The advantage of using the shift registers is to improve overall system performance, which can not be possibly achieved in image sensors producing analog signals. As soon as the bit signals in the data registers are dumped into the shift registers, the data registers become available to take in a set of new values resulting from the respective latch circuits due to a new exposure. Overall, the signal throughput rate is increased. In FIG. 3F, there is shown a set of timing diagrams to demonstrate that a second exposure is started when the outputs from the first exposure are being readout.

Figure 3G:
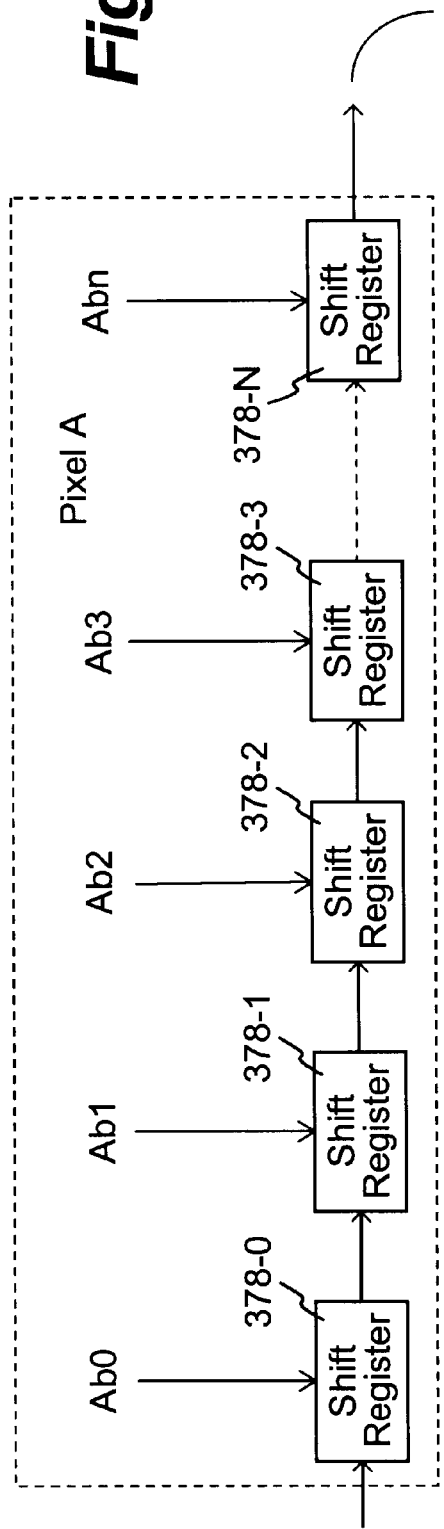
FIG. 3G demonstrates a second implementation of the register circuit in FIG. 3A in which only shift registers are used.
Figure 3H:
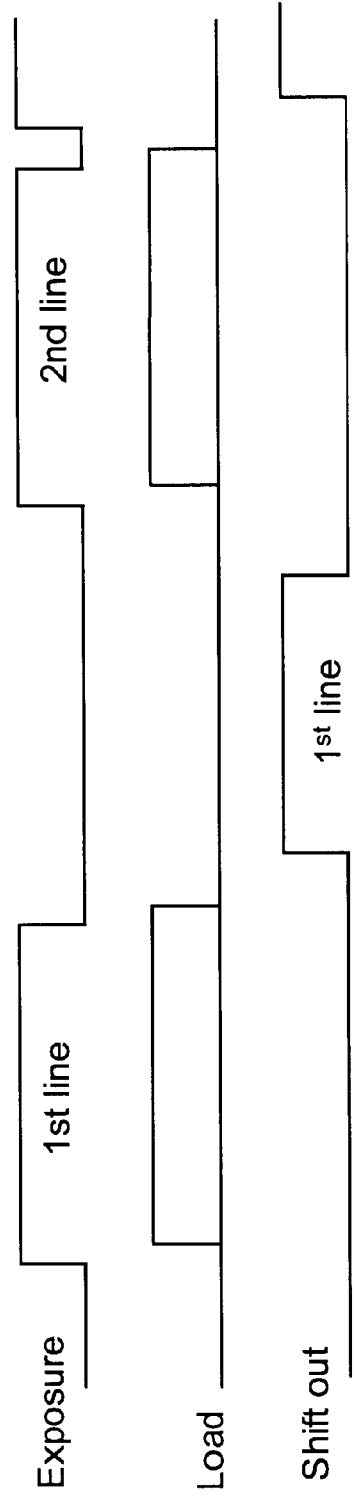
FIG. 3H shows a set of timing diagrams corresponding to FIG. 3G.

FIG. 3G illustrates another implementation of register circuit 208 of FIG. 2 in which only shift registers 378 are used. Each of shift registers 378 receives one bit of the output from a respective latch circuit and the bit signals in shift registers 378 are serially shifted out to produce the digital signal. The advantage of this implement is the smaller number of registers in use but it does require that the photodetectors wait till the signals in shift registers 378 are completely shifted out. FIG. 3H shows a set of corresponding timing diagrams in which it is shown that the next exposure must not occur till the current signals are completely shifted out.

Now it is clear that the resultant digital images or signals are obtained from the time measurement on the accumulation of incident photons in each of the photodetectors and the implementation of the time elapsed measurement system takes far less area than the A/D converters in a sensor. Further the charge signals do not have to go across many photodetector circuits before being digitized and the possible distortions in the resultant digital images from the present invention have been minimized.

Figure 5:
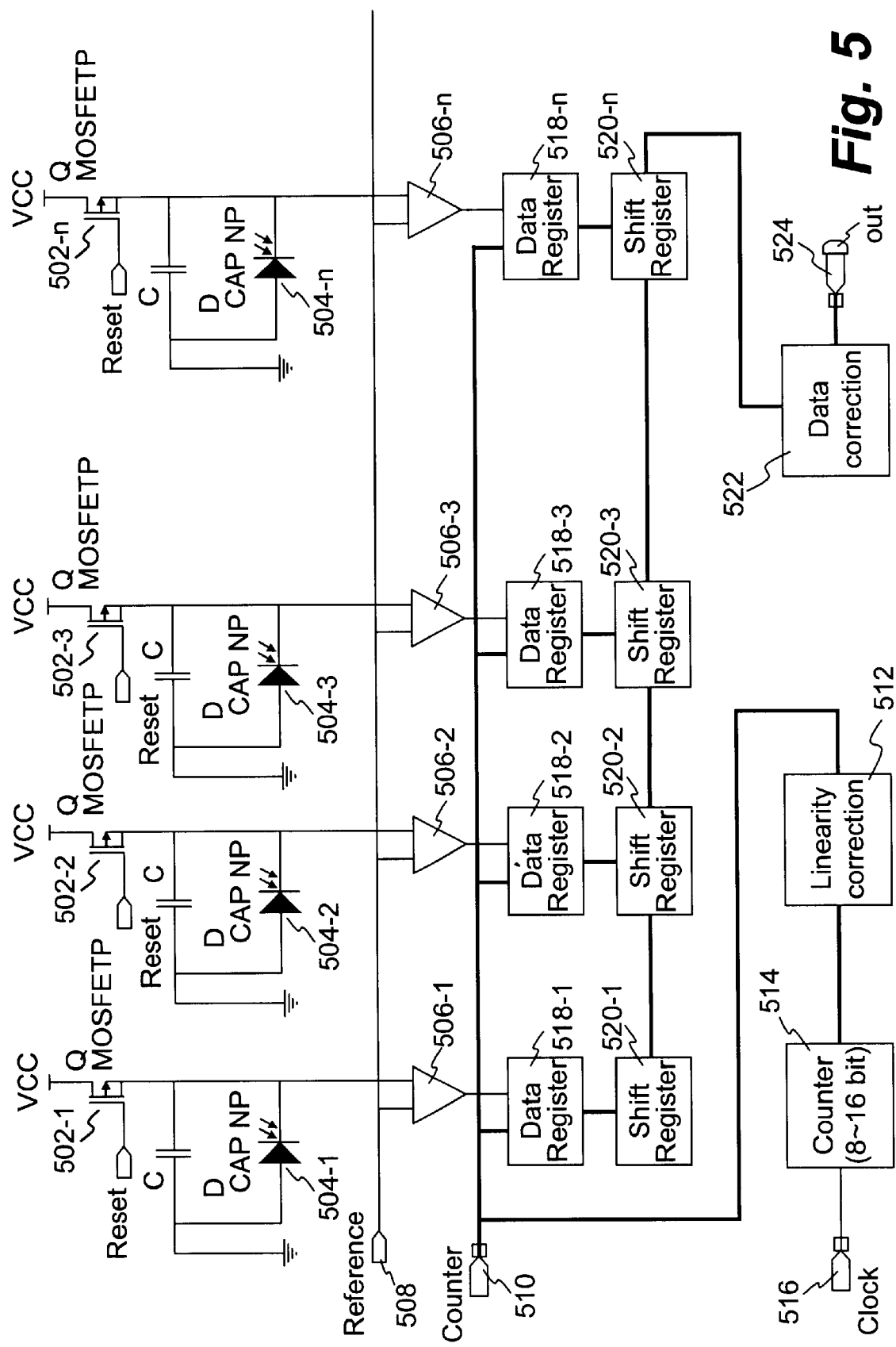
FIG. 5 illustrates a detailed circuit layout implementing the present invention according to one embodiment therof.

FIG. 5 shows a circuit layout according to an embodiment of the present invention. A reset pulse applied at "Reset" connectors of MOSFET transistors 502 causes all the photodiodes 504 to be charged to Vcc. Depending on light (photon) intensity, photodiodes 504 start discharging process when exposed to the light. Comparators, i.e. gate circuits 506 output signals when corresponding photodiodes have discharged to the level of the reference signal applied at "Reference" connector 508.

A time mark signal being counted is applied at "Counter" connector 510. In this embodiment, the time mark signal is used as a reference to linearity correction block 512 in which the precision function is implemented. Further shown in the figure is a counter 514 that is driven by a system clock signal at "Clock" connector 516. The resultant digital signals are obtained by shifting the digital representations of the charge signals in photodiodes 504. In general, the resultant digital signals are coupled to a data correction circuit 522 for a desired correction (e.g., gamma correction). The final digital signals representing a scene or a capture are output at 524.

The present invention has been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

What is claimed is:

1. A system for generating digital signals in a sensor, the system comprising:

an array of photodetectors, each responsive to light impinged thereupon and independently producing a charge signal after the photodetectors are collectively reset by a reset signal;

a counter receiving a time mark signal and producing a count number with reference to the time mark signal;

a plurality of time mark measurement modules collectively receiving a reference signal and the count number from the counter, each of the time mark measurement modules coupled to one of the photodetectors and outputting a digital representation of the charge signal from the one of the photodetectors with reference to the reference signal and the count number from the counter, wherein the reference signal has a magnitude level piecewise adjusted over time; and a plurality of register circuits, each connected to one of the time mark measurement modules and receiving the digital representation therefrom, wherein the digital representation from each of the time mark measurement modules is sequentially shifted out to form the digital signals.

2. The system as recited in claim 1, wherein the array of the photodetectors is configured as a one-dimensional image sensor array.

3. The system as recited in claim 1, wherein the array of the photodetectors is configured as a two-dimensional area image sensor.

4. The system as recited in claim 1, wherein each of the time mark measurement modules comprises:

a gate circuit receiving the reference signal and the charge signal from the one of the photodetectors; the gate circuit outputting a signal when the charge signal reaches the reference in magnitude; and a latch circuit receiving the count number from the counter and latching in the count number when receiving the signal from the gate circuit to measure time elapsed for the charge signal to reach the reference in magnitude and outputting the digital representation of the charge signal, wherein the digital representation is the count number at the time the charge signal reaches the reference in magnitude.

5. The system as recited in claim 4, wherein each of the register circuits comprises a number of data registers and shift registers, the data registers connected to the one of the time mark measurement modules and receiving the digital representation therefrom, the shift registers coupled respectively to the data registers and receiving the digital representation therefrom.

6. The system as recited in claim 5, wherein the digital representation in shift registers is serially shifted out.

7. The system as recited in claim 5, wherein the digital representation is represented in bits of signals and each one of the bits of signals being in one of the shift registers and wherein the bits of signals are shifted out the shift registers in parallel.

8. The system as recited in claim 1 further comprising a precision circuit coupled to the counter and producing a modified count number with respect to the count number from the counter.

9. The system as recited in claim 8, wherein the precision function comprises:
a look-up-table coupled to the counter and responsive to the count number therefrom, the look-up-table producing the modified count number with reference to the count number from the counter.

10. The system as recited in claim 1, wherein the counter obtains the count number in the time mark signal from a highest possible number in the digital representation.

11. A system for generating M-bit digital signals in a sensor, the system comprising:
an array of N photodetectors, each coupled to a transistor and charged to a voltage level when being reset by a reset signal, in response to light impinged upon the photodetectors, each of the photodetectors producing a charge signal by discharging respectively from the voltage level at a rate in proportion to the light intensity;
N gate circuits collectively receiving a reference signal that is piecewise increased over time, each of the N gate circuits receiving respectively the charge signal from the each of the N photodetectors and producing a pulse signal when the charge signal reaches the reference signal in magnitude;
a counter receiving a time mark signal and producing a count number with reference to time marks in the time mark signal;
N latch circuits collectively receiving the count number; each of the N latch circuits further communicating respectively with the each of gate circuits and latching in respectively the count number as soon as the pulse signal is received from the each of the N gate circuits; and
N register circuits, each coupled to one of the N latch circuits and receiving the count number therefrom, the count number being sequentially shifted out of the N register circuits to produce the digital signals.

12. The system as recited in claim 11, wherein the N photodetectors, the N gate circuits, the counter, the N latches and the N register circuits are fabricated in a Complementary Metal-Oxide Semiconductor (CMOS) as the sensor.

13. The system as recited in claim 12, wherein each of the register circuits comprises:

M data registers storing the count number; and
M shift registers, each connected to one of the M data registers, receiving the count number from the M data registers;
wherein the count number is shifted from the M shift registers in one of the N register circuits in parallel to the M shift registers in another one of the N register circuits.

14. The system as recited in claim 12, wherein each of the register circuits comprises:
M shift registers, each receiving one bit of the count number in binary, the one bit of the count number in each of the M shift registers is serially shifted out to form the M-bin digital signals.

15. The system as recited in claim 12, wherein the photodetectors are configured as a one-dimensional array.

16. The system as recited in claim 12, wherein the photodetectors are configured as a two-dimensional array.

17. The system as recited in claim 12, wherein the reset signal is a pulse signal that causes the N photodetectors to be charged to the voltage level.

18. The system as recited in claim 11 further comprising a signal correction circuit that causes the count number to be modified according to a correction function before the count number is received in the N latch circuits.

19. The system as recited in claim 18, wherein the signal correction circuit comprises a look-up-table having input entries and respective output entries, a corresponding output from the output entries replacing the count number to be received by the N latch circuits.

20. The system as recited in claim 18, wherein the correction function is a gamma function with which the count number is corrected by the signal correction system.

21. A method for generating digital signals in a sensor comprising photodetectors thereon, the method comprising:
accumulating incident photons in the photodetectors to generate a charge signal in each of the photodetectors;
comparing, using a comparing circuit, the charge signal with a reference signal that is piecewise increased over time;
producing a pulse signal by the comparing circuit when the charge signal reaches the level of the reference signal;
measuring time elapsed by a latch circuit receiving a count number from a counter for the charge signal to have reached the level of the reference signal; and
dumping bits of signals representing the measured time to a register circuit for readout process.

22. The method as recited in claim 21, wherein said accumulating incident photons in the photodetectors comprises:
charging the photodetectors to a voltage level; and
discharging the photodetectors respectively from the voltage level to generate the charge signals proportional to the incident photons accumulated respectively in the photodetectors.

23. The method as recited in claim 22, wherein said measuring time elapsed by a latch circuit comprises:
counting time marks in a time mark signal by the counter to producing the measured result; and latching in the measured time as soon as the charge signal reaches the level of the reference signal.

24. The method as recited in claim 23, said measuring time elapsed by a latch circuit further comprises:

modifying the measured result with respect to a correction function circuit.

25. The method as recited in claim 24, wherein the correction function is a predefined function so that the measured result can be adjusted accordingly.

26. The method as recited in claim 24, wherein the correction function is a gamma function so that the measured result can be corrected with respect to the human visualization.

27. The method as recited in claim 21, wherein said register circuit comprises:

a number of data registers and the same number of shift registers, each of the data registers being coupled to one of the shift registers; and the shift registers receiving the bits of signals through the data registers.

28. The method as recited in claim 27, wherein said dumping bits of signals representing the measured time to a register circuit for readout process comprises:

shifting the bits of signals in parallel out of the shift registers.

* * * * *